United States Patent [19]

Collopy et al.

[11] Patent Number: 4,821,196

[45] Date of Patent: Apr. 11, 1989

[54] HIGH RESOLUTION AUTOMATIC FOCUS CORRECTION ELECTRONIC SUBSYSTEM FOR E-BEAM LITHOGRAPHY

[75] Inventors: Thomas K. Collopy, Hopewell Junction; Donald F. Haire, Verbank, both of N.Y.

[73] Assignee: International Business Machines Corporation, Armonk, N.Y.

[21] Appl. No.: 17,114

[22] Filed: Feb. 20, 1987

[51] Int. Cl.⁴ .................. B23Q 15/12; G01B 11/14
[52] U.S. Cl. .................. 364/468; 250/491.1; 250/492.3
[58] Field of Search ............... 364/468, 488, 489, 490; 250/491.1, 492.2, 492.3

[56] References Cited

U.S. PATENT DOCUMENTS

| | | | |
|---|---|---|---|
| 4,070,117 | 1/1978 | Johannsmeier et al. | 364/468 |
| 4,103,998 | 8/1978 | Nakazawa et al. | 364/468 |
| 4,405,989 | 9/1983 | Tsukada et al. | 364/468 |
| 4,468,565 | 8/1984 | Blair et al. | 250/491.1 |
| 4,568,861 | 2/1986 | Doran et al. | 250/397 |

Primary Examiner—Allen MacDonald
Attorney, Agent, or Firm—Graham S. Jones, II

[57] ABSTRACT

This electronic signal processing system is a subsystem of an automatic focus system for an E-beam lithography tool. This subsystem allows the automatic focus system to achieve resolution of 0.25 microns. An automatic focus system is composed of several subsystems. The first is an optical subsystem which produces a focused image of a source aperture on a transducer, which is the second subsystem. This image moves across the transducer in response to variations of the z-position of the measured surface. The transducer, in this case a linear photodiode array, converts the optical position signal into an electronic signal similar to a television video signal. The signal processing subsystem produces multiple outputs from the electronic signal produced by the transducer. The analog correction output of this subsystem realizes a mathematical function of the measured z-height. This analog output is sent to the focus correction subsystem of the E-beam tool, thus achieving focus correction. A digital z-height measurement output is sent to the computer subsystem of the E-beam tool. The computer uses this value to compute deflection magnification corrections and rotation corrections.

7 Claims, 8 Drawing Sheets

FIG. 2
PRIOR ART
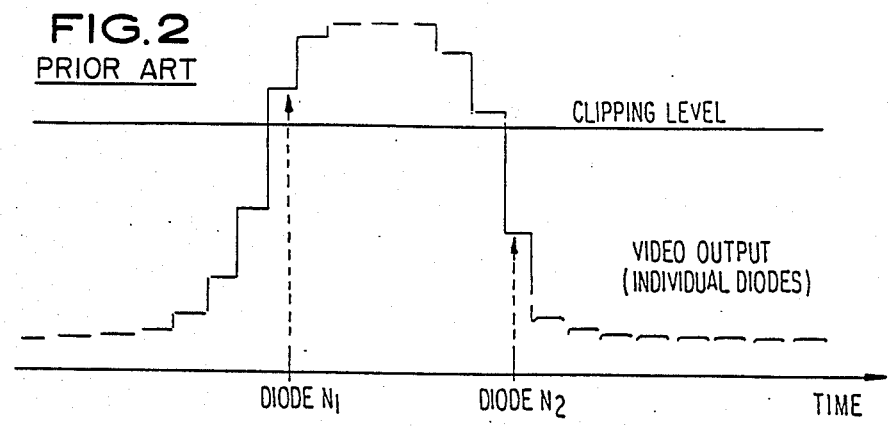
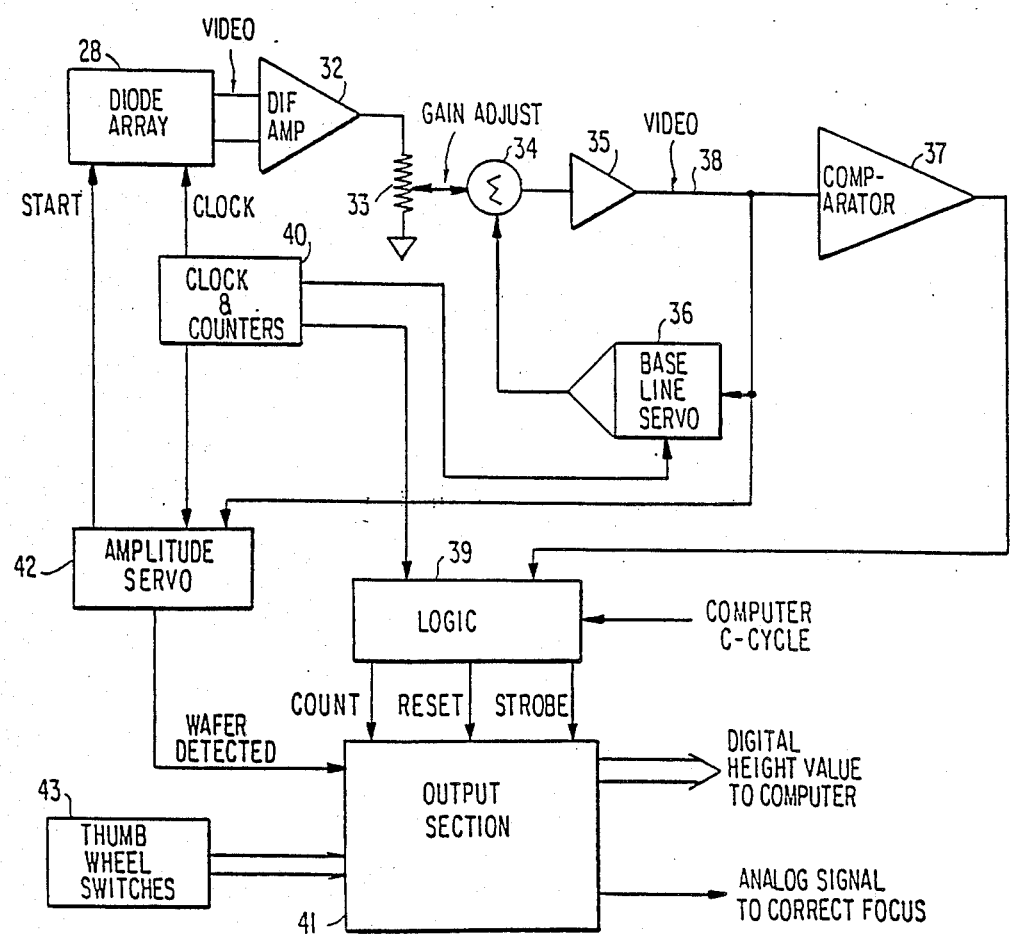
AUTO FOCUS ELECTRONICS
FIG. 3
PRIOR ART

REMOTE RETICON TIMING

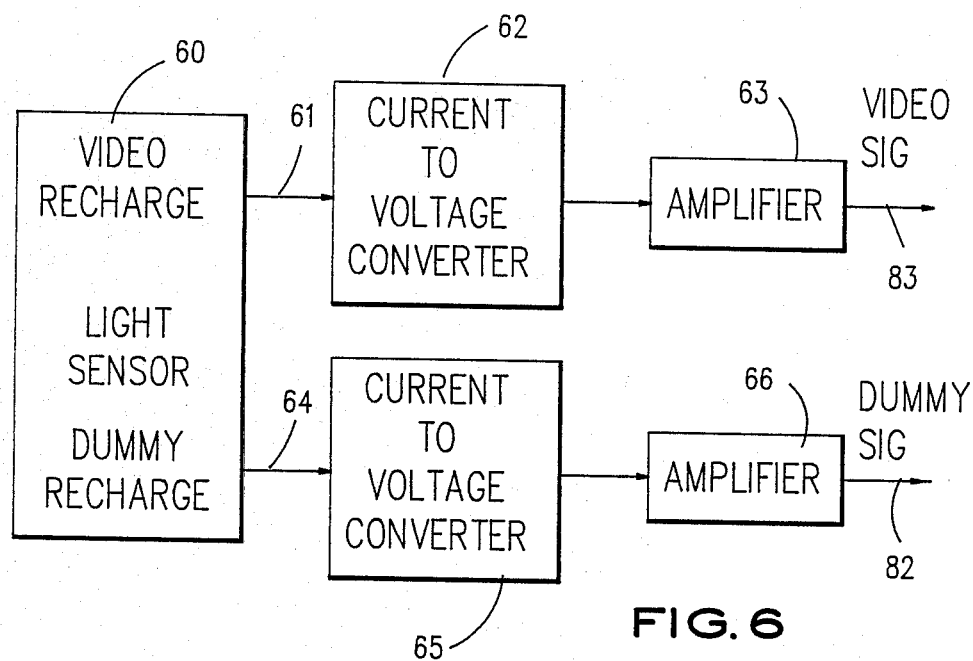
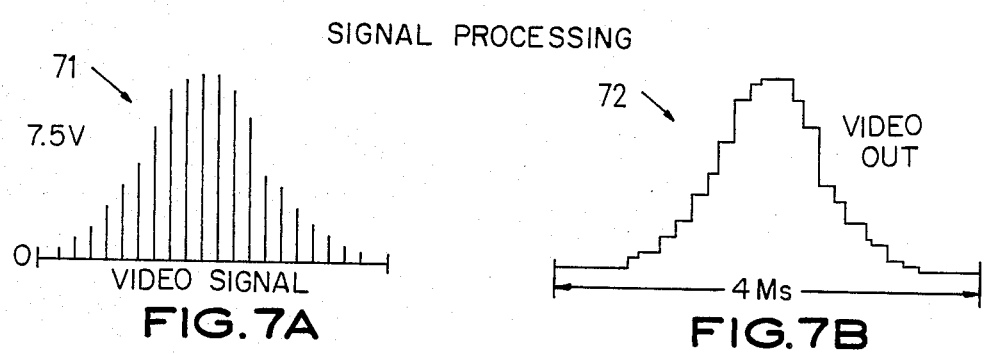
FIG.7A  FIG.7B
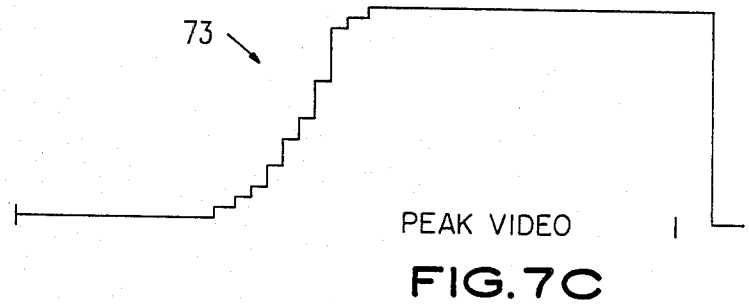
FIG.7C

HIGH RESOLUTION AUTOMATIC FOCUS CORRECTION ELECTRONIC SUBSYSTEM FOR E-BEAM LITHOGRAPHY

BACKGROUND OF THE INVENTION

1. Field of the Invention

This invention relates to E-beam lithography and particularly to a correction system for the elimination of the effects of variations of the height of the wafer or mask surfaces. Such variations tend to degrade focus (image quality) and deflection magnification and rotation (unregistered writing.)

2. Description of Related Art

Commonly assigned U.S. Pat. No. 4,468,565 of Blair et al for an "Automatic Focus and Deflection Correction in E-Beam System Using Optical Target Height Measurements" describes a prior art autofocus system. The specific part of the Blair et al system which has been improved upon with this invention is the autofocus electronic subsystem.

FIG. 1 illustrates the optical subsystem interface between the system optics and the electronic subsystem. This optical system basically incorporates "light lever" techniques adapted specifically to the particular conditions unique to an E-beam exposure tool. The criterion of E-beam use are satisfied by the optical system shown in FIG. 1.

The light source forms an image of the slit on the surface of the target. This slit image is reflected off the target through the optics shown in FIG. 1 to the light transducer i.e. a light sensor. This light sensor converts the light image into a video output. It is this video output which is used by the automatic-focus (autofocus) electronics to determine the height of the target. As shown in FIG. 1, variations of the z-position of the target surface 15 by plus or minus delta z causes the slit image 16 to move vertically to the position 9' from position 9. It is this correlation between the linear position of the video signal on the sensor to the change in height which allows for the measurement of the height of the target.

The Blair et al autofocus electronic subsystem uses, as an input, the typical video signal output of the diode array 28 in FIG. 3, which output is shown in FIG. 2. The output from the diode array 28 has a clipping level established by means of a comparator 37 to determine which of the diodes N1, N2, ... Nn, (where there are n diodes) in the array 28, for example, diode N1, corresponds to the leading edge of the light beam and which diode, N2, corresponds to the trailing edge of the light beam. The electronic subsystem utilizes the output of the diode array, as shown in FIG. 2, and converts that output into signals needed for correcting the E-beam focus and deflection. Moreover, the electronic subsystem of FIG. 3 adjusts the sensor signal magnitude to compensate for varying conditions, such as, a varying reflectivity of the target surface.

Referring now to FIG. 3, the autofocus electronics subsystem of the prior art is described in more detail. The video output signal shown in FIG. 2, from the diode array 28 shown in FIG. 3 is initially fed to a difference amplifier 32 and then to a gain adjusting control resistor 33. A base line servo correction 36 is then added to the video signal at the summing junction 34 of the amplifier 35.

The baseline servo 36 is required to correct for DC offset drift in the amplifiers 32 as a result of large DC gain necessary to amplify the small diode signal and raise it to a level that can be processed by the comparator 37 in FIG. 3. The resulting video output signal 38 is then identical to that in FIG. 2 where the clipping level is used by a comparator 37 to determine which diode (N1) corresponds to the leading edge of the light beam and which diode (N2) corresponds to the trailing edge of the light beam shown in the output of FIG. 2.

The system of FIG. 3 utilizes logic circuits 39 receiving the comparator 37 output and secondly the output from the clock 40 to generate a count equal to the number of diodes from the beginning of the diode array 28 to the center of the light beam. An output section 41 receives the count together with a reset signal and a strobe signal.

The output section 41 performs multiple functions. First, it converts the serial count from the logic 39 into a parallel output word sent to a controller computer, not shown. Also, the output section employs a digital-to-analog converter to produce an analog output used to correct the E-beam focus, directly. These two outputs are indicated in FIG. 3.

The values of height which are transmitted to the computer and to the focus coil driver of the E-beam assembly are periodically updated when pulses occur on the strobe and reset lines.

FIG. 3 shows an input-to-logic 39 in the form of "computer" C-cycle. This input indicates that the E-beam system is in a table move mode and accordingly the system is at a point in operation where updating of the autofocus outputs can occur. In the table move mode, there is neither writing nor registration of the system but rather a physical adjustment is being made to the specimen which permits updating of the autofocus outputs. Accordingly, utilizing the C-cycle input to the logic section 39, updating occurs at a point in the processing where there is no substantive E-beam operation.

FIG. 3 shows an amplitude servo 42 receiving respective inputs from the clock and counters 40 and the base line servo 36. The amplitude servo 42 is utilized to compensate for different resists and for different reflectives due to different resists and different structures on the wafers. The amplitude servo 42 is also used to compensate for drift in the LED light output and amplifier gain drift. The amplitude servo is further used to measure the output of the strongest diode and determine whether it is of the proper amplitude. If the output is too low, the amplitude servo 42 increases the time between start pulses sent to diode array 28. An increase in time between start pulses allows the diodes in the array 28 to receive light for a longer period of time, and therefore have a larger signal when read out. Conversely, if the signal is too large, the time between start pulses is decreased, which results in a decrease in output amplitude. If the amplitude servo 42 does not detect a signal, then, an output is delivered to the output section 41 indicating that a wafer is not present. As a result, the output section switches to preprogrammed default values which are stored in thumbwheel switches 43.

As shown in FIG. 3, the output section 41 provides a digital output to the computer controller representing the measured height of the chip which is being written. The computer then uses this value to compute and apply corrections to the magnification and rotation of the magnetic deflection corresponding to the measured height during unregistered reading.

Also, as shown in FIG. 3, the output section 41 provides an analog signal which is used directly and automatically to correct the E-beam focus for different heights of each chip on the wafer.

The resolution attainable with the Blair et al autofocus electronic subsystem is limited by the signal processing schemes employed.

First, the signal processing scheme used to read the light transducer is unable to provide the signal-to-noise ratios needed to operate at this resolution.

Second, the method used in a subsystem of this invention to determine the height, which generates the focus, magnification, and rotation corrections, is theoretically not able to achieve a resolution beyond 1 micron. The subsystem determines the height of the target based on the leading and trailing edges of the video signal. The video signal is generated from the readout of discrete photodiodes in the sensor. Since the leading and trailing edges of the video signal are in discrete steps, there is no chance to interpolate between diodes. Because the distance between diodes corresponds to a height change of one micron, it is impossible to have a resolution higher than 1 micron.

Third, the video signal amplitude servo used in the Blair is unable to provide the accuracy needed to work at this resolution. Digital techniques were employed in the Blair et al amplitude servo which cause changes to be made in the amplitude of the sensor output every time the sensor is read out. These continuous sensor output amplitude variations make it impossible to work at a higher resolution.

SUMMARY OF THE INVENTION

In accordance with this invention, a system is provided for an electronic signal processing system is a subsystem of an automatic focus system for an E-beam lithography tool. This subsystem allows the automatic focus system to achieve resolution of 0.25 microns. An automatic focus system is composed of several subsystems. The first is an optical subsystem which produces a focused image of a source aperture on a transducer, which is the second subsystem. This image moves across the transducer in response to variations of the z-position of the measured surface. The transducer, in this case a linear photodiode array, converts the optical position signal into an electronic signal similar to a television video signal. The signal processing subsystem produces multiple outputs from the electronic signal produced by the transducer. The analog correction output of this subsystem realizes a mathematical function of the measured z-height. This analog output is sent to the focus correction subsystem of the E-beam tool, thus achieving focus correction. A digital z-height measurement output is sent to the computer subsystem of the E-beam tool. The computer uses this value to compute deflection magnification corrections and rotation corrections.

BRIEF DESCRIPTION OF THE DRAWINGS

FIG. 2 is a diagram showing the video output signal of a prior art diode array, after it has been processed by the electronic subsystem, as a function of time.

FIG. 3 is a block diagram of the prior art autofocus electronic subsystem.

FIG. 6 is a diagram of the remote reticon unit of the autofocus electronic subsystem of FIG. 4.

FIGS. 7A-7C are diagrams of electrical signals found in the signal processing section of the autofocus electronic subsystem of FIG. 4.

Figure 1:
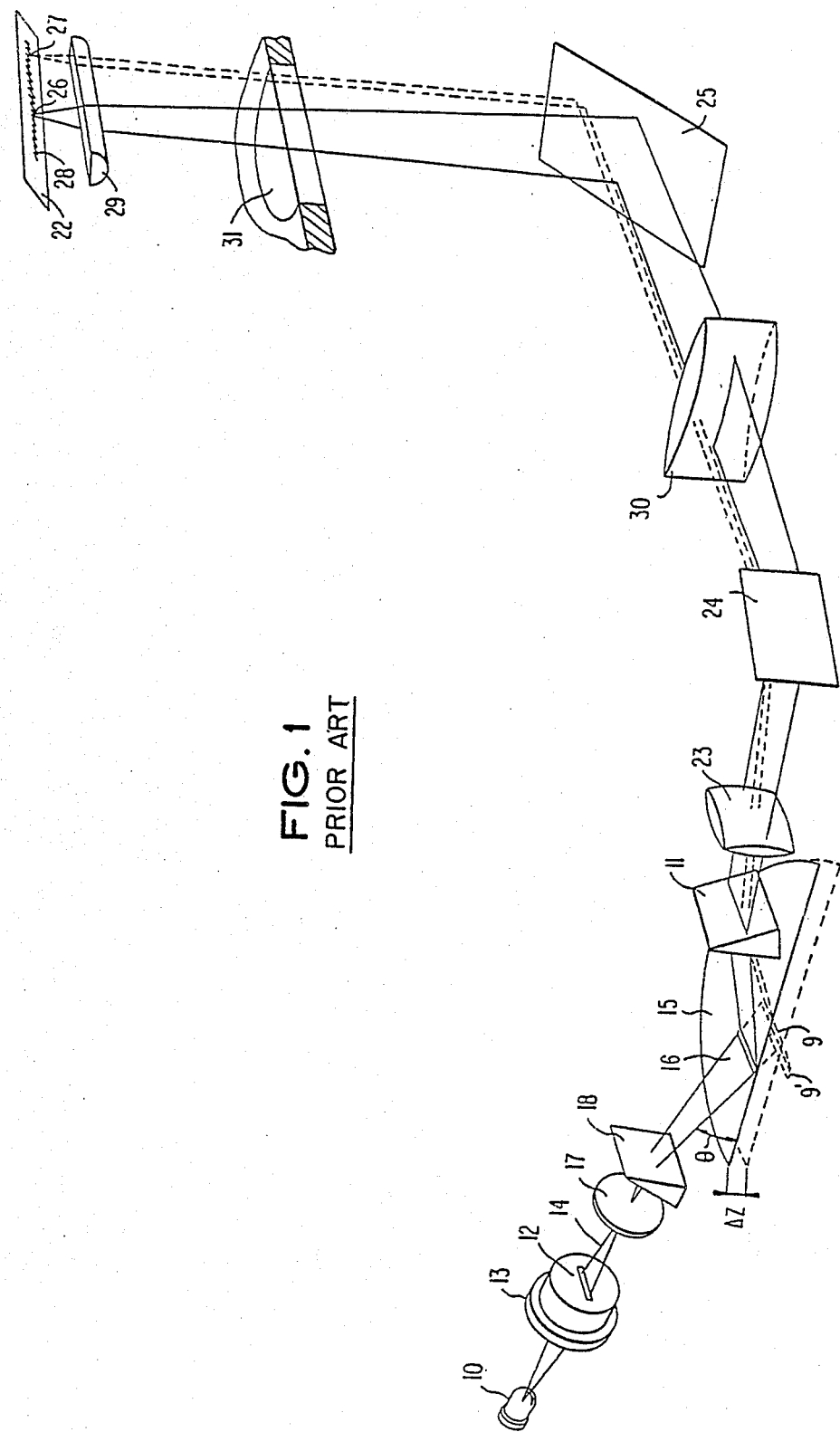
FIG. 1 is a schematic view showing the optical system, used for measuring the z-position of the target surface, to which the electronic subsystem interfaces.

The foregoing and other objects, features and advantages of the invention will be apparent from the more particular description of the preferred embodiments of the invention which follows.

DESCRIPTION OF THE PREFERRED EMBODIMENT

Disclosure of the Invention

This disclosure describes an electronic subsystem used in a high resolution automatic focus correction system for E-beam lithography. The automatic focus correction system is designed to determine the height of the target so that errors due to variations in the height of the target can be minimized. The electronic subsystem is used to produce one or more outputs which represent the height of the target. The height of the target is determined from a signal sensed at the output of a light sensor.

This electronic subsystem has a resolution four times better than the prior state-of-the-art. The essential elements of this invention which are needed to obtain a factor of four improvement in resolution are the resolution of height determination circuitry, the stability and accuracy of the automatic amplitude control circuitry, and the signal-to-noise ratio of the sensor signal at the input to the height determination circuitry.

The key feature of the height determination circuitry is its ability to interpolate between the outputs of individual photodiodes of the light sensor. The height determination circuitry is designed to determine the mean area of the light sensor signal and then determine the location of that mean area relative to the beginning of the light sensor readout. The height determination circuitry executes the following procedure to accomplish this.

The first of a pair of sensor readouts is integrated to determine the area of the light sensor signal. This value is then divided by 2 to generate a reference signal whose magnitude represents the mean area of the light sensor signal. While the second of the pair of sensor readouts is being integrated the result of the integration is being compared to the value of the mean area generated by the previous sensor readout. When the value of the second integration equals the value of the mean area the location of the mean area has been found. This location represents the height of the target.

This method of height determination allows for interpolation between the signals produced by discrete photodiodes of the light sensor because it compares the results of two analog integrations which are linear, not discrete. The ability to interpolate between photodiodes eliminates the spacing of the photodiodes as the determining factor in the resolution of the autofocus electronic subsystem. The resolution of the subsystem is then limited by the signal-to-noise ratio at the input to the height determination circuitry and the stability and accuracy of the automatic amplitude control circuitry. The resolution of the prior state-of-the-art is limited by the photodiode spacing and by the signal-to-noise ratio.

The automatic amplitude control circuitry is needed to maintain the height of the light sensor signal over consecutive readouts of the light sensor. It is designed to operate on every other readout of the light sensor, generating pairs of sensor readouts of the same height. It is designed to make linear height corrections to the output of the sensor, not discrete incremental adjustments as in the prior state-of-the-art. The ability to make linear height adjustments allows for rapid and accurate adjustments to signal height for large variations in light intensity. This fast response time is needed to maintain the accuracy of the height determination circuitry.

Referring to FIG. 1, as the height of the target moves up or down as indicated by 9 and 9' in FIG. 1, the position of the peak of the video signal moves right or left as indicated by 26 and 27 in FIG. 1. The subsystem electronics are designed to detect the position of the peak of the video signal.

Figure 4:
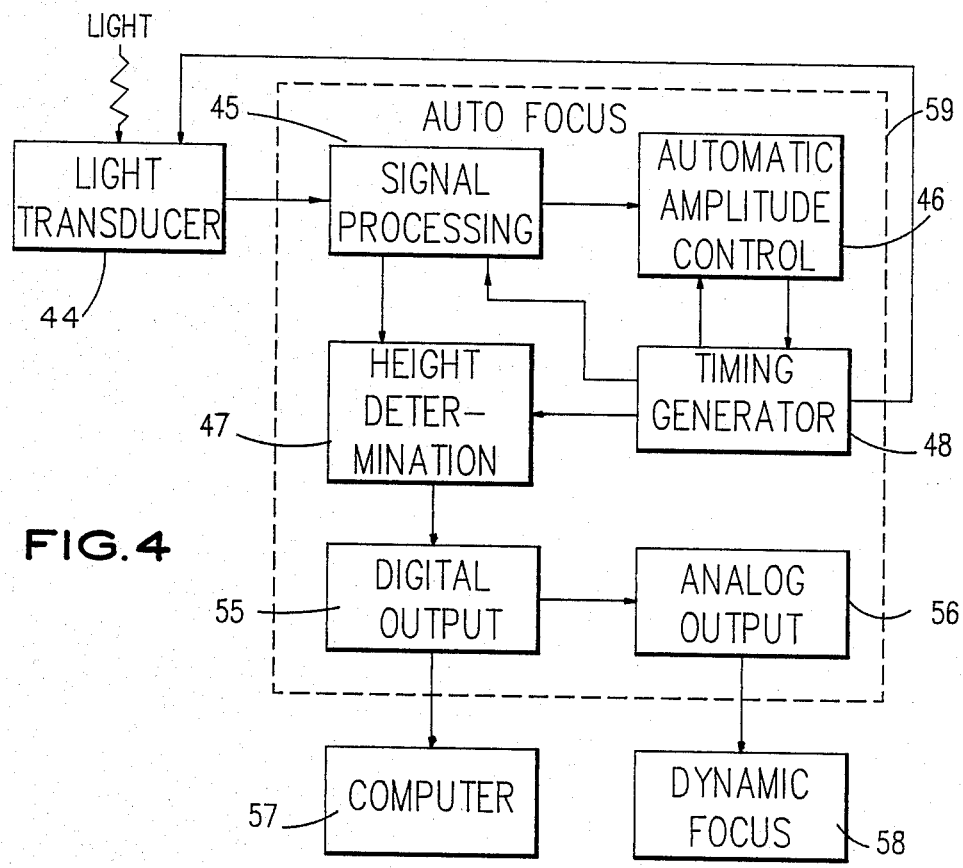
FIG. 4 is a block diagram of an autofocus electronic subsystem in accordance with this invention.
Figure 8:
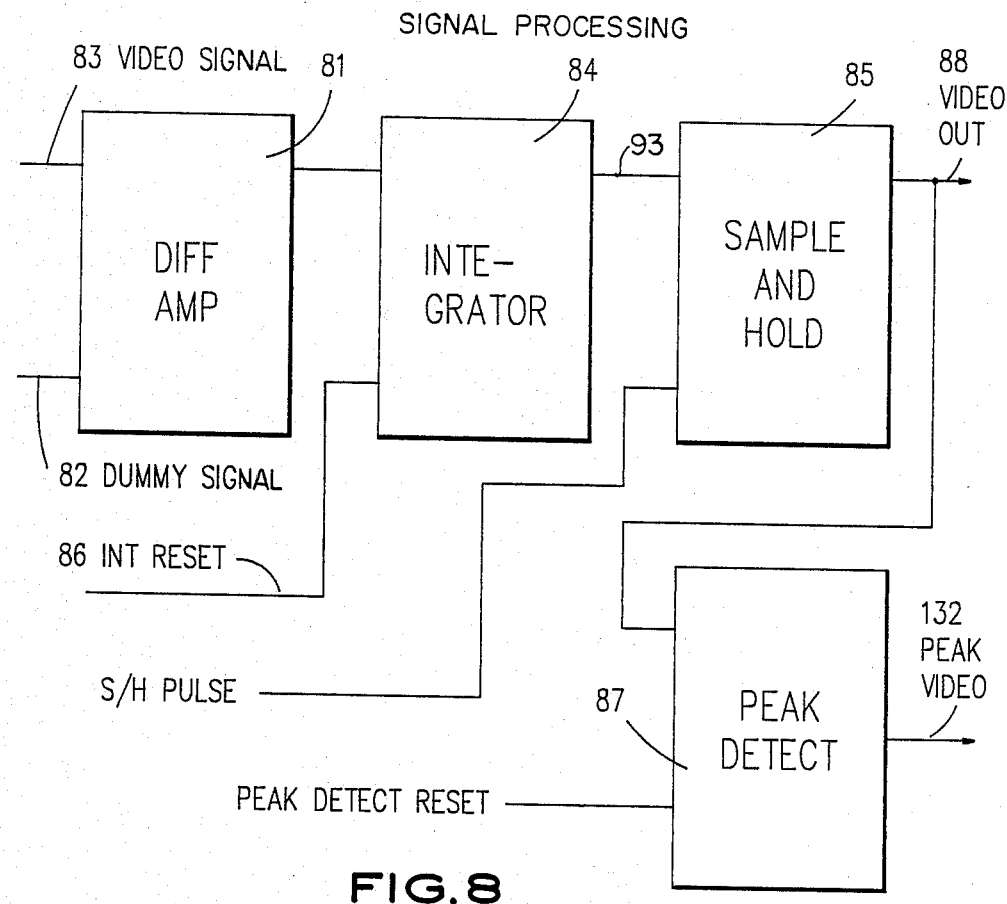
FIG. 8 is a block diagram of the signal processing section of the autofocus electronic subsystem.
Figure 12:
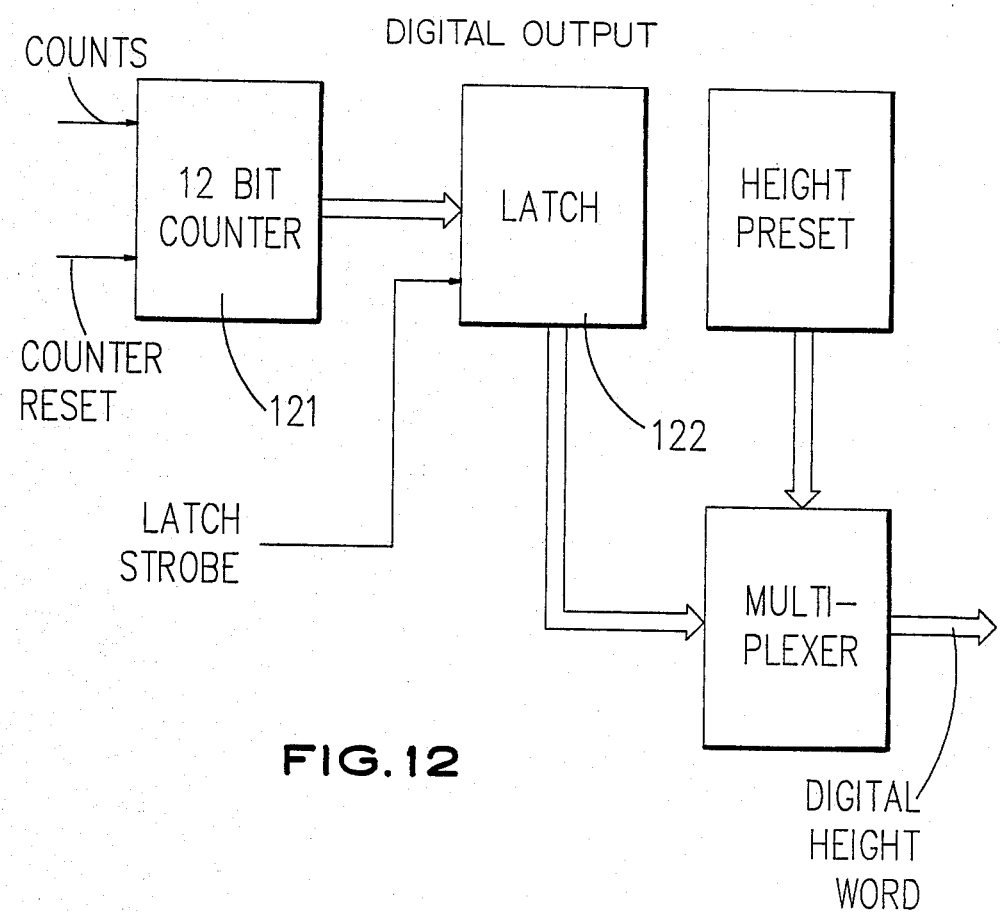
FIG. 12 is a block diagram of the digital output section of the autofocus electronic subsystem.
Figure 13:
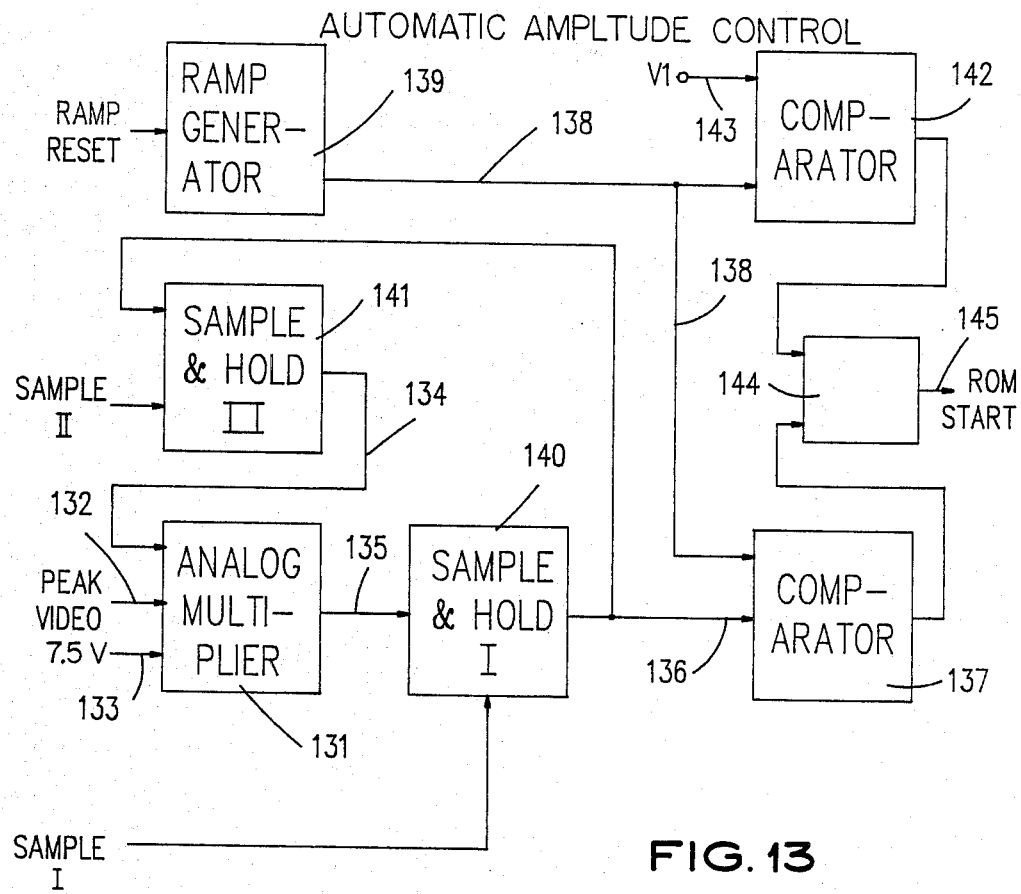
FIG. 13 is a block diagram of the automatic amplitude control section of the autofocus electronic subsystem.

As with the prior art, the electronic subsystem is comprised of the light sensor and the subsystem electronics as shown in FIG. 4. A light transducer 44 comprising a remote reticon shown in FIG. 6 with its remote reticon timing shown in FIG. 5 has its output connected to the signal processing subsystem 45 in the autofocus system 59. The signal processing subsystem 45 shown in detail in FIG. 8 provides inputs to height determination subsystem 47 and automatic amplitude control 46. It receives input timing from timing generator 48. The height determination subsystem 47 shown in detail in FIG. 10 supplies an input to the digital output subsystem 55 shown in detail in FIG. 12, which in turn supplies inputs to the analog output 56 and outside the autofocus system to supply the digital height word to the computer 57. Analog output supplies an output from the autofocus system to the dynamic focus input 58 of the E-beam system. The automatic amplitude control 46 shown in detail in FIG. 13, has an output to the timing generator and it receives timing inputs from the timing generator. The timing generator 48 supplies an output to the height determination subsystem 47, as well.

TIMING GENERATOR, REMOTE RETICON, AND SIGNAL PROCESSING SUB-SYSTEMS

Figure 5:
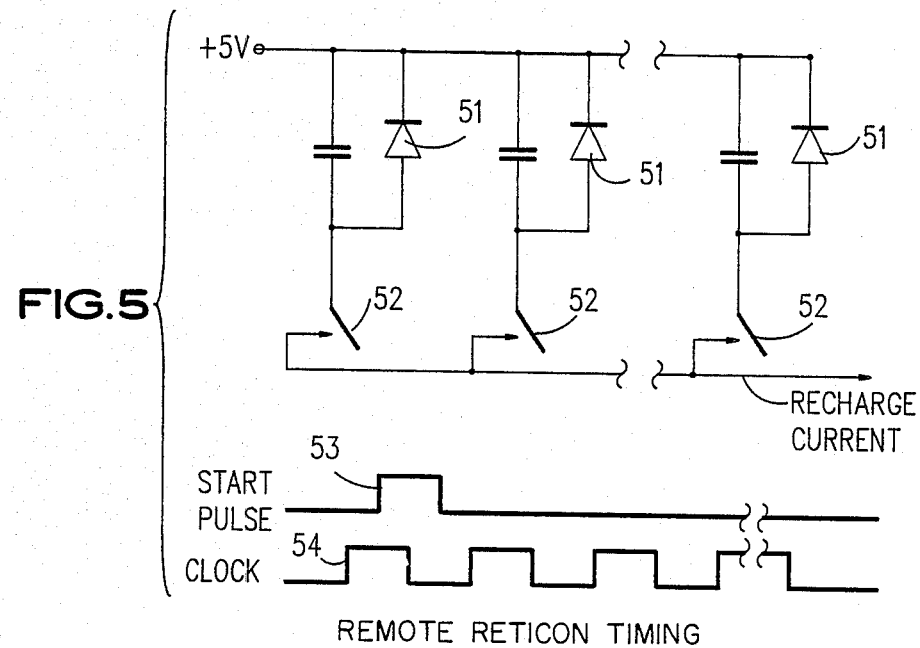
FIG. 5 is a diagram of the timing for the remote reticon unit of the autofocus electronic subsystem.

The light sensor shown in FIG. 5 contains a string of 512 photo diodes 51 and the necessary switching circuitry 52 to read diodes 51 sequentially. The inputs to the sensor are START pulse 53, which begins a readout, and a sequence of CLOCK pulses 54, each of which controls the readout of a corresponding individual diode 51. The output of the sensor 44 in FIG. 4 is a video signal which shows the position of the light striking it relative to the position of the diode string. The output of the light sensor is sent through signal processing circuitry 45 in the electronic subsystem which serves to amplify and smooth the output of the light sensor 44.

Referring to FIG. 6 the video recharge output 61 and the dummy recharge output 64 of the light sensor 60 are a set of currents, each of which is converted to a voltage using a charge-transfer current-to-voltage converter 62, 65. The output of the current-to-voltage converter 62, 65 is a series of voltage spikes 71 shown in FIG. 7. Each spike 71 represents the output from one of the 512 photo diodes inside the sensor 60. This string of voltage spikes 71 is amplified by amplifiers 63 and 66 respectively in FIG. 6. and sent to the subsystem electronics on lines 83 and 82 respectively as described below in connection with FIG. 8. The sensor produces the video signal representing the light striking the sensor plus the switching noise of the sensor and a dummy signal which is just the noise of the sensor. The subsystem electronics receives the video and dummy signals with a difference amplifier 81 in FIG. 8.

This method of signal processing differs from the prior art in the technique of using a charge-transfer current-to-voltage converter. The charge-transfer current-to-voltage converter uses a capacitor to transfer the light sensor current signal to a voltage signal at the output of an amplifier. This technique increases the amplitude of the output present at the input to the subsystem electronics versus what was present in the prior art. This increased signal size represents an increase in the signal-to-noise ratio of the system. This increased signal-to-noise ratio is needed to obtain the increased resolution. The increased signal amplitude also reduces the gain needed in the subsystem, eliminating the need for the baseline offset servo 36 in FIG. 3.

The outputs of the current-to-voltage converters 62 and 65 pass through amplifiers 63 and 66 respectively to provide video signal 83 and dummy signal 82 as the inputs 82 and 83 in FIG. 8 to a difference amplifier 81. Difference amplifier 81 substracts the dummy signal 82 from the video signal 83. This removes the sensor noise from the video signal.

The output of this difference amplifier 81 is the input to the next signal processing stage, i.e. integrator 84 and sample and hold circuit 85 (also called the smoothing circuitry.) The smoothing circuitry is designed to smooth the 512 peaks of the sensor output. This smoothing was previously done with an amplifier that had its bandwidth limited. This bandwidth limit took place at the output of the sensor amplifier. This bandwidth limiting distorted the shape of the video signal output. Since the prior art determined the height based on the leading and trailing edges of the video signal, any distortion of these edges would cause an absolute error in the height measured.

The smoothing circuitry of this invention is designed not to distort the critical portions of the video signal. The smoothing process converts the 512 voltage spikes of the light sensor output 71 in FIG. 7 into a staircase video output 72. The video output 72 is similar, in shape, to the prior art, but is without the distortion.

Figure 9:
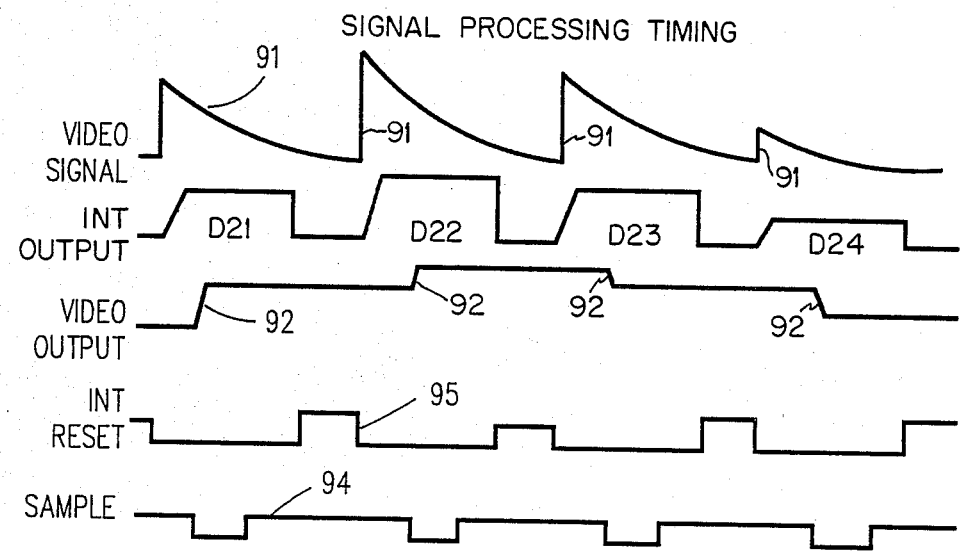
FIG. 9 is a diagram of the timing signals in the signal processing section of the autofocus electronic subsystem.

The smoothing circuitry in FIG. 8 incorporates an integrator 84, a sample and hold module 85, and a integrator reset control 86. The smoothing is done by integrating the voltage spike 91 in FIG. 9, holding onto the output 93 of the integrator 84 with the sample and hold module 85, then resetting the integrator for the next voltage spike. FIG. 9 shows the INTEGRATOR RESET timing 95 and the SAMPLE and hold timing 94. After the video signal is processed to produce video output signal 92 and video output pulse 72 in FIG. 7, it is sent on line 88 to the height determination circuitry 47 in FIG. 10 and on line 132 to the video output amplitude control circuitry 46 in FIG. 13. This smoothing circuitry causes no distortion of the video signal other than its intended purpose.

HEIGHT DETERMINATION SUBSYSTEM

A significant feature of this invention with respect to the prior art is the method used to determine the height of the target. This method allows for a resolution greater than what was physically possible with the previous method of height determination.

Recall that the height determination is done by finding the center of the video signal referenced to the first diode, in the string of 512, of the light sensor (refer to the discussion of FIGS. 1-3 above for details). The center of the video signal can be defined as the point in the signal where half of the area under the signal envelope is to the left of center and half is to the right of center. Herein the system employs signal processing techniques to find this center point based on the area of the video output.

The area under the video output is found during the first of a pair of sensor readouts. The number which represents the area under the first video output is divided by 2. As the area of the second video signal is being added up, a comparison is being done between it and half the value of the area of the previous video. When the area of the current video output is equal to half the area of the previous video output, then the center of the video output is found.

This method of height determination, based on area under the video output allows for interpolation between light sensor diodes. Interpolation between diodes is possible because the area under the curve changes smoothly rather than by discrete amounts. It is this discreteness which does not allow the system of FIGS. 1-3 to achieve greater resolution. The interpolation creates the ability to increase the resolution capabilities of the autofocus electronics subsystem.

Figure 10:
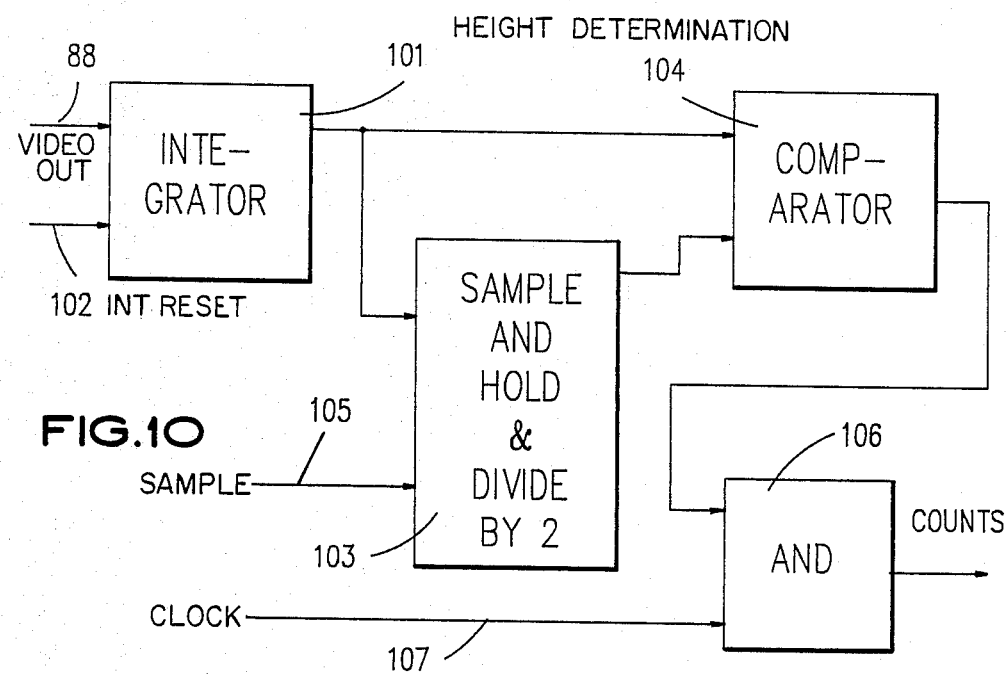
FIG. 10 is a block diagram of the height determination section of the autofocus electronic subsystem.
Figure 11:
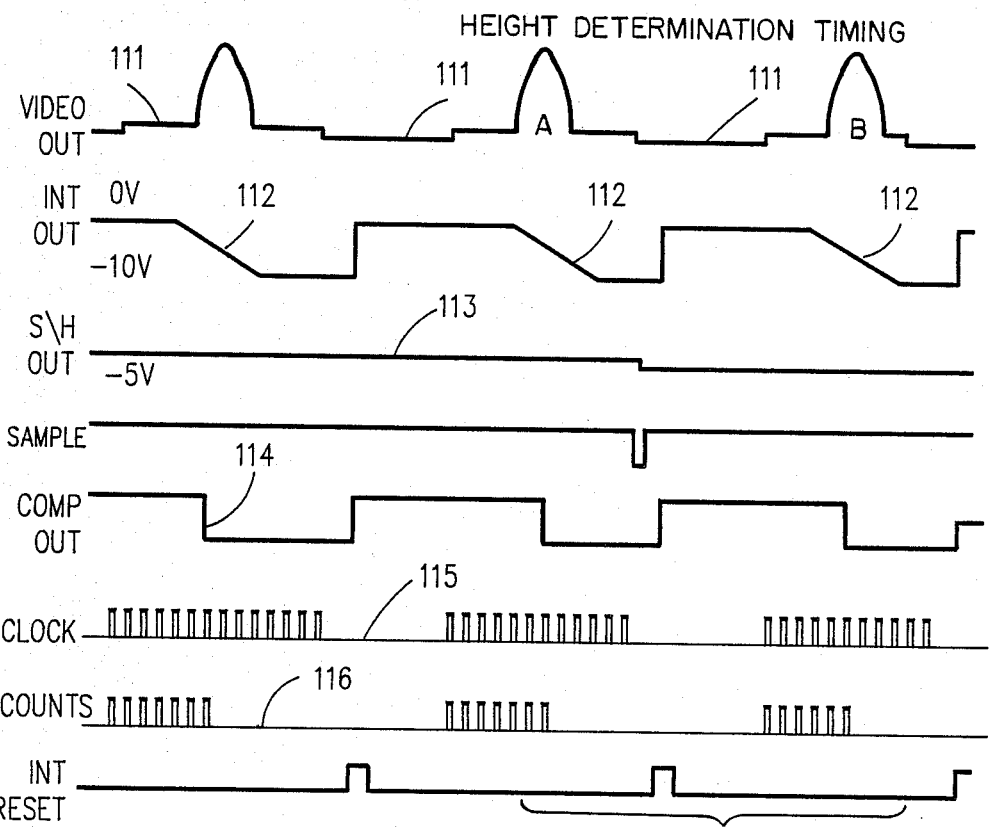
FIG. 11 is a diagram of the timing signals in the height determination section of the autofocus electronic subsystem.

The height determination circuitry in FIG. 10 incorporates an integrator 101, an integrator reset control 102, a sample and hold module 103, a sample and hold control line 105, an AND gate 106, a CLOCK line 107, and a comparator 104. At the beginning of each readout of the light sensor the integrator output 112 is at zero volts. The integrator 101 then integrates the video output 111. During alternating readouts of the light sensor, the output of the integrator 112 is stored in the sample and hold 103. The output of the integrator is also one of the inputs to the comparator 104. The output of the sample and hold 113 is divided by two and is the other input to the comparator. The integrator is then reset in preparation for the next video output. When the value of the second of a pair of integrations equals half the value of the first of the pair of integrations the comparator switches state 114. This switching of states occurs in the center of the video output.

The center of the video output represents the position of the light striking the sensor. This position is directly proportional to the height of the target. The switching of the comparator output 114 marks the center of the video output in time. The actual digital height word is generated by allowing clock pulses 116 to a counter 121, starting at the beginning of a light sensor readout, and stopping the clock pulses 116 when the comparator switches state. The output of this counter 121 represents the height of the target. The output is stored into a latch 122 after the second of a pair of video outputs and then transferred to the computer 1 in FIG. 1 and focus control circuitry 2.

The amplitude servo 3 in FIG. 4 is controlled in such a way that it does not operate between the pair of video outputs used to determine the location of the light striking the sensor. Therefore, both video outputs have the same height and the same area. This technique of pairing video outputs of the same area together eliminates the amplitude control circuitry as a source of error in the determination of the position of the light striking the sensor. This, too, is a feature of this invention not incorporated in the system of FIGS. 1 to 3.

AUTOMATIC AMPLITUDE CONTROL SUBSYSTEM

The pairing of video signals for height measurement greatly reduces the sensitivity of this system to signal amplitude. Nevertheless, to achieve necessary signal-to-noise ratio in the processing, a certain minimum signal amplitude is required. Further, to achieve necessary stability of the final outputs of this system, the signal amplitudes must be kept very stable. Therefore, an analog amplitude servo 43 that is required instead of the digital servo of the system of FIGS. 1-3. This allows the electronic subsystem to adjust accurately and precisely the height of the video output for changes in LED intensity or target reflectivity. The digital nature of the system of FIGS. 1-3 caused the height of the video output to toggle between two heights. This toggling prevents measurement of the height of the target with the accuracy produced in the instant autofocus electronic subsystem. This servo technique eliminates the toggling. The servo is also required to generate the pair of video outputs needed for the height determination circuitry.

The height of the video output is proportional to the length of time between sensor readouts. By adjusting the time between readouts, the amplitude of the video output can be adjusted. The amplitude servo uses the following analog technique to adjust the video output amplitude.

The servo uses analog multiplication to calculate the ratio of the desired amplitude to the actual video output amplitude. The ratio of heights is then multiplied by a voltage signal which represents the time between readouts. The voltage signal which is generated replaces the previous voltage signal which represented the time between readouts. The time between readouts will now be adjusted using this signal level. This signal level will produce a signal that is the exact height desired versus the prior art which generated a digitized approximation of the height.

Another key feature of this servo is that if there is no adjustment needed, the ratio of the actual video signal amplitude to the desired amplitude will be one to one, and no adjustment will be made. The prior art used a digitizing technique which forced a height change even when one was not needed. The signal that determines the time between sensor readouts is allowed to change only every other video signal, thus creating pairs of video outputs of the same amplitude and area.

The amplitude servo is used to maintain the height of the peak of the video signal at 7.5 volts. The servo is necessary because the intensity of the light striking the sensor and thus the amplitude of the output of the sensor changes. These light intensity changes are due to changes in the reflectivity of the target.

The amplitude servo incorporates a peak detector circuit 87 connected by line 132 to an analog multiplier 131, two sample-and-hold modules 140 and 141, a ramp generator 139, and two comparators 137 and 142.

The peak detector 87 captures the peak of the video output 72 and its output 73 is one of the inputs to the analog multiplier 131. Another input to the multiplier is a 7.5 volt reference 133. The third input to the multiplier 134 is a voltage which represents the integration time (time between sensor reads) of the last video output. The analog multiplier outputs a voltage 135 which is equal to 7.5 volts divided by the peak detector voltage multiplied by the old integration time voltage. This voltage is the integration time voltage. This voltage is held in one of the sample-and-hold modules 140 and it is one of the inputs 136 to the comparator 137. The second input to the comparator 138 is the output of the ramp generator 139 which begins its ramp at the end of the sensor readout.

The ramp generator 139 produces on line 138 a RAMP OUTPUT signal 146 and the voltage on line 138 starts at zero volts and rises linearly until its output equals the integration time voltage on line 136 from sample-and-hold unit I 140. When the RAMP OUTPUT voltage 146 equals the integration time voltage the comparator 137 changes state. The state change generates a ROM START clock pulse 142 which causes the timing generator to begin its timing sequence. Part of the timing sequence is a RAMP RESET signal 148 which resets the ramp generator 139 and another part triggers a readout of the light sensor.

The amplitude of the output of the sensor is directly proportional to the length of time the light has been shining on it before it is read out. Increasing the time between readouts causes video output 72 in FIG. 7 to grow and decreasing the time between readouts causes video output 72 to shrink. Therefore, the video output amplitude is controlled by the time it takes the ramp generator voltage 146 to rise up to the integration time voltage on line 136. If the peak of the video output rises above 7.5 volts the output 135 of the multiplier 131 is decreased and it takes less time for the ramp generator 139 to reach the lower integration time voltage level 136. Just the opposite happens if the peak of the video output falls below 7.5 volts.

The integration time voltage on line 136, which is produced from the output of the multiplier 131, is held in sample-and-hold module 140. The output 136 of this sample-and-hold 140 is allowed to change only every other sensor readout. This creates pairs of video outputs with the same peak height and thus the same area. This dual read system allows the height determination circuitry to be insensitive to the automatic amplitude control servo.

After the first of a pair of reads the integration time voltage on line 136 is transferred from the first sample-and-hold module 140 to the output of the second sample-and-hold module 141 and becomes the old integration time voltage 134. Using the peak from the second of a pair of readouts a integration time is generated by the multiplier 131. At the end of that pair of reads the integration time voltage 135 is transferred to the output of the first sample-and-hold 140. This voltage level will determine the height of the next two sensor reads.

The second comparator 142 is used to generate the timing generator start pulse 147 when the light level striking the sensor is too low. If the time between light sensor readouts needs to be greater than a preset amount on line 143 the second comparator 142 generates the timing generator ROM START pulse 147.

Because of the techniques used to determine the height of the target for the increased resolution, a method of generating the needed timing was used. The timer is a E-PROM based system. All timing for the electronic subsystem and the remote sensor is generated by the timing generator 44 in FIG. 4. The generator produces timing for the light sensor 45, the automatic amplitude servo 43, the height determination circuitry 46, the signal processing circuitry 47.

Figure 15:
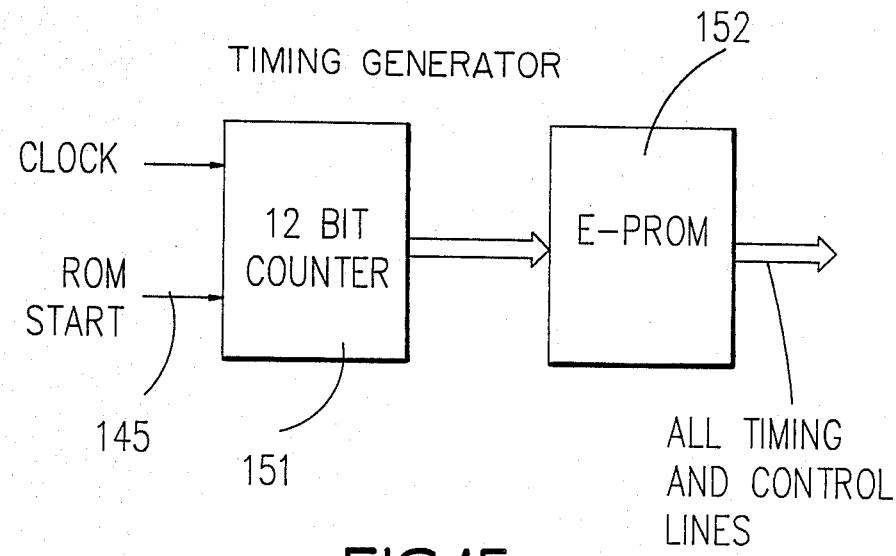
FIG. 15 is a block diagram of the timing generator section of the autofocus electronic subsystem.
Figure 14:
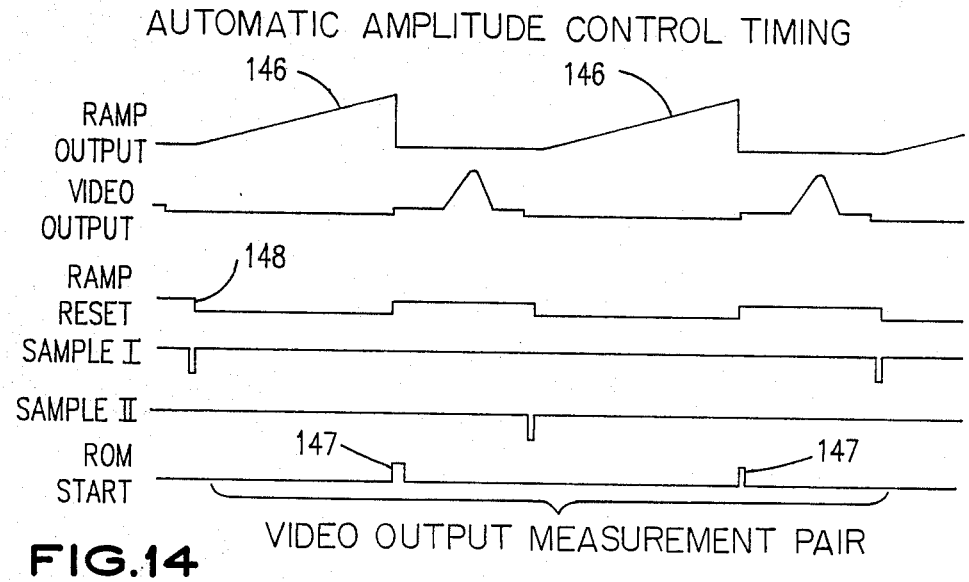
FIG. 14 is a diagram of the timing signals in the automatic amplitude control section of the autofocus electronic subsystem.

The timing generator in FIG. 15 is built with a 12 bit counter 151, an E-PROM 152, two latches, and a digital single shot. The ROM START pulse 147 coming from the amplitude control servo 144 on line 145 from FIG. 13 starts the counter 151 counting up. The outputs of the counter 153 are the sequential address lines of the E-PROM 152. The eight data lines of the E-PROM are the timing and control lines. The E-PROM sends out the command to stop the counter when the sequence is completed. The E-PROM is programmed to output the proper timing signals at each change of the counter. A digital single shot allows a start pulse 147 in FIG. 14 to occur only after the E-PROM has stepped through its timing sequence.

SUMMARY

Through the invention of this autofocus electronic subsystem, the resolution of the autofocus system is increased to 0.25 microns. This increased resolution allows for higher accuracy pattern writing in E-beam lithography. The invention has the following improvements over the prior art.

1. Signal-to-noise ratios which allow for high accuracy E-beam lithography.
2. Height determination technique, using interpolation, needed to achieve the necessary resolution.
3. Amplitude servo technique which eliminates itself as a source of error in the height determination technique.
4. This invention improves the resolution of an optical/transducer system of 1 micron resolution to 0.25 micron. The signal processing described here would provide this 4X improvement to a higher resolution optical/transducer system, for example 0.5 micron to 0.125 micron. It is the capacity for 4X improvement which is afforded by this invention.

INDUSTRIAL APPLICABILITY

This invention is applicable manufacturing processes useful in the manufacture of electronic chips useful in data processing equipment such as large scale computers.

What is claimed is:

1. An electronic signal processing system for automatic focusing of an E-beam lithography tool with respect to the position of a measured surface comprising,
    (a) a transducer having an output, (b) optical means for providing a focused position image of a source aperture on said transducer, said image moving across said transducer in response to variations of said position of said measured surface, (c) said transducer converting said position image into an electronic signal, (d) signal processing means for producing multiple outputs from the electronic signal produced by said transducer having an input connected to said output of said transducer, (e) said signal processing means including a charge-transfer current-to-voltage converter, (f) height determination means for providing an analog correction output as a mathematical function of the measured position, and (g) means for coupling said analog output to an output system connected to means for a focus correction subsystem of an E-beam tool.

2. A system in accordance with claim 1 wherein signal processing means includes means for smoothing said electronic signal.

3. A system in accordance with claim 1 wherein said height determination means includes interpolation means for interpolating between a pair of sequential outputs from said transducer to improve resolution of said output of said height determination means.

4. In a beam autofocusing system for correcting beam focus as a function of variations between a target surface and a reference point, including:

(a) a source of radiation;

(b) first optical means for projecting an image using radiation from said source onto said target surface;

(c) second optical means for redirecting said image from said target surface onto an image plane;

(d) transducer means for receiving said image positioned on said image plane, and in response to said image for producing an electronic output indicative of the position of said target surface relative to said reference point;

(e) circuit means coupled to said transducer means for converting said electronic output signal into a focus correction signal for said beam; and (f) said circuit means including a charge-transfer current-to-voltage converter.

5. In an autofocusing system for correcting beam focus as a function of variations between a target surface and a reference point, including:

(a) a source of optical radiation;

(b) first optical means for projecting an image using optical radiation from said source onto said target surface;

(c) second optical means for redirecting said image from said target surface onto an image plane;

(d) transducer means for receiving said image from said image plane, and in response to said image for producing an electronic output indicative of the position of said target surface relative to said reference point, said transducer including an array of radiation sensors each providing an output signal;

(e) circuit means coupled to said transducer means for converting said electronic output signal into a focus correction signal for said beam; and (f) said circuit means including position determination means for employing interpolation between the outputs of said radiation sensors, whereby the resolution of said autofocusing system is enhanced.

6. In a beam autofocusing system for correcting beam focus as a function of variations between a target surface and a reference point, including:

(a) a source of radiation;

(b) first optical means for projecting an image using radiation from said source onto said target surface;

(c) second optical means for redirecting said image from said target surface onto an image plane;

(d) transducer means for receiving said image from said image plane, and in response to said image for producing an electronic output indicative of the position of said target surface relative to said reference point;

(e) circuit means coupled to said transducer means for converting said electronic output signal into a focus correction signal for said beam; and (f) said transducer means including means for producing a series of voltage spikes in response to the output of said transducer.

7. In an automatic positioning system for correcting position as a function of variations between a target and a reference point, including:

(a) transducer means for receiving an image of said target positioned for receiving said image, and in response to said image for producing an electronic output indicative of the position of said target relative to said reference point, said transducer including an array of radiation sensors each providing an output signal;

(b) circuit means coupled to said transducer means for converting said electronic output signal into a position correction signal for said target; and (c) said circuit means including position determination means for employing interpolation between the outputs of said radiation sensors, whereby the resolution of said positioning system is enhanced.

* * * * *